United States Patent [19]

Schuh

[11] 4,065,646
[45] Dec. 27, 1977

[54] POWER CONVERTER
[75] Inventor: Peter Otto Schuh, Indianapolis, Ind.
[73] Assignee: Bell Telephone Laboratories, Incorporated, Murray Hill, N.J.
[21] Appl. No.: 700,325
[22] Filed: June 28, 1976
[51] Int. Cl.² .............................................. H04B 3/36
[52] U.S. Cl. ................................ 179/170 R; 179/81 B
[58] Field of Search ............... 179/16 F, 18 F, 18 FA, 179/81 B, 170 R, 170 T, 1 HF

[56] References Cited

U.S. PATENT DOCUMENTS

| 3,359,378 | 12/1967 | Skeer | 179/170 R |
| 3,448,217 | 6/1969 | Leman et al. | 179/81 B |
| 3,706,862 | 12/1972 | Chambers | 179/170 R |
| 3,946,169 | 3/1976 | Miya | 179/170 R |
| 3,989,906 | 11/1976 | Kiko | 179/16 F |

OTHER PUBLICATIONS

Mitra, "Analysis and Synthesis of Line Active Networks", 1969, John Wiley & Sons, Inc., Chapter 2, p. 43.

*Primary Examiner*—William C. Cooper
*Assistant Examiner*—Randall P. Myers
*Attorney, Agent, or Firm*—Harry L. Newman

[57] ABSTRACT

In a two-wire bidirectional telephone transmission line, a power converter and a directional threshold detector form in combination an impedance transparent bilateral voice-signal controller which can supply stable voice-switched gain to a dominant signal originating from either direction and a simultaneous, equal loss to any signals propagating from the other direction without separating the respective signals.

8 Claims, 7 Drawing Figures

DUAL POWER CONVERTERS

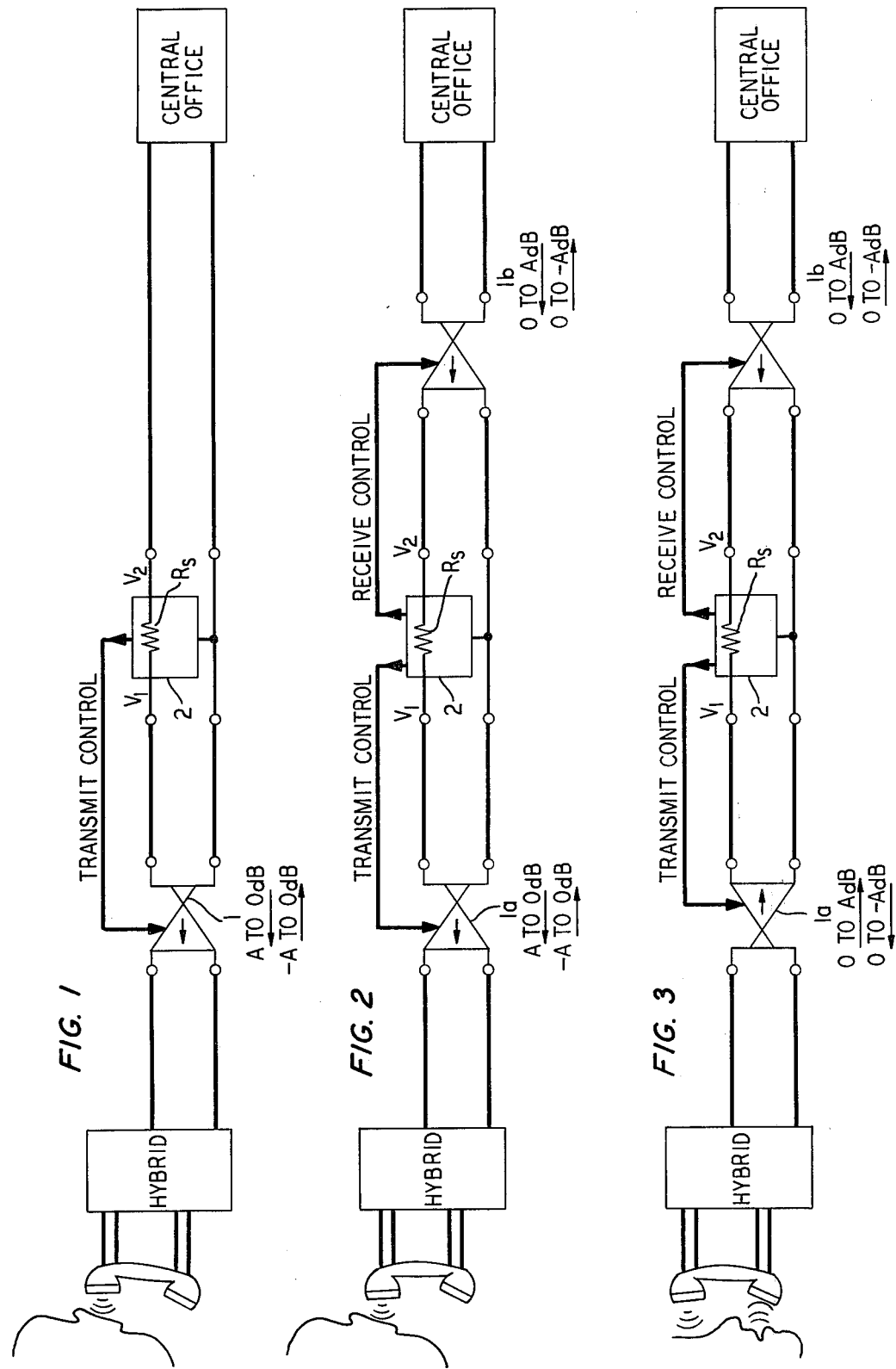

POWER CONVERTER REALIZATION

TYPE I

POWER CONVERTER REALIZATION

TYPE II

DUAL POWER CONVERTERS

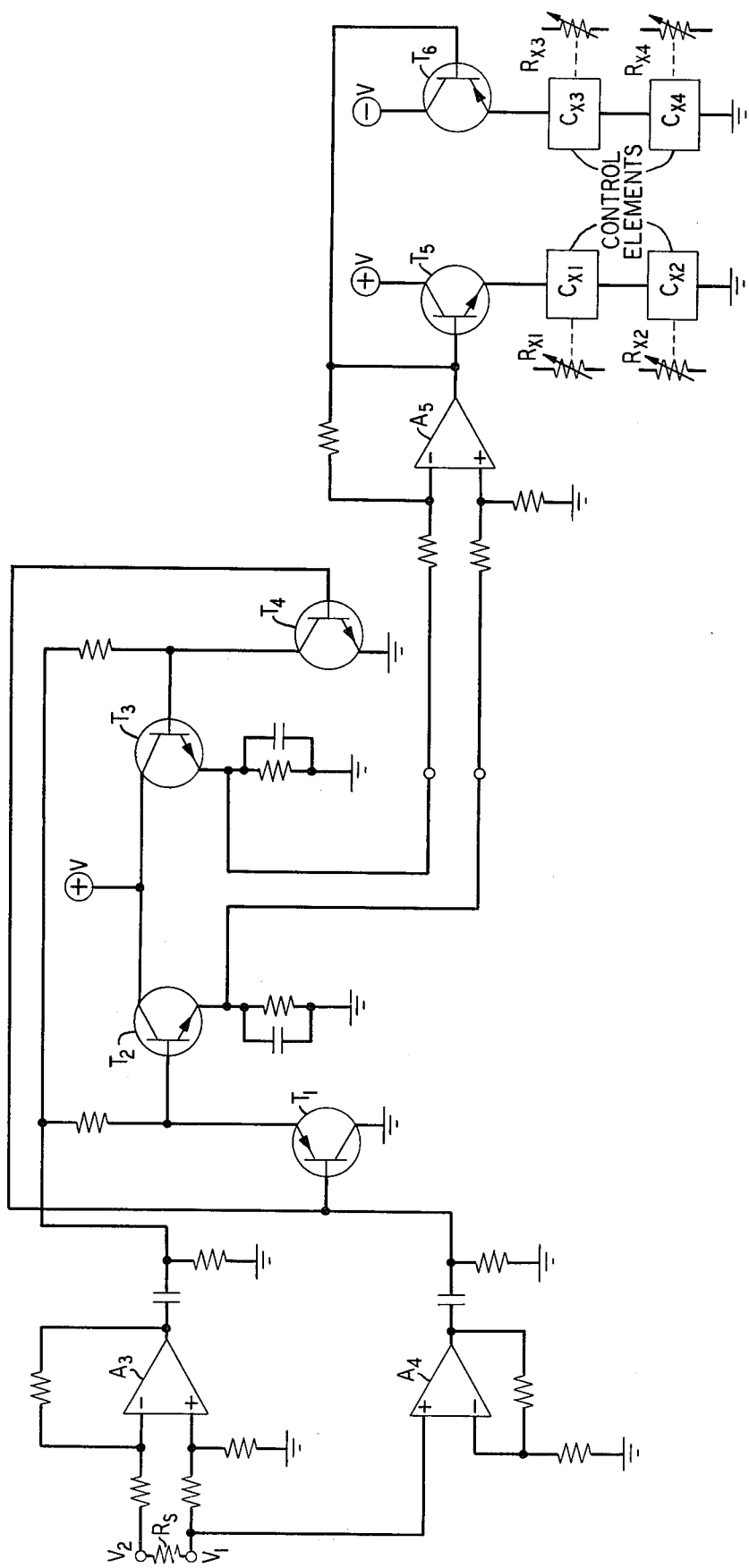
FIG. 7 DIRECTIONAL THRESHOLD DETECTOR 2

POWER CONVERTER

BACKGROUND OF THE INVENTION

1. Field of the Invention

This invention relates to a power converter and a power converter combined with a directional threshold detector to provide an AC-signal controller generally suitable for use in the two-wire portion of a telephone transmission line and particularly adapted for use in either a handicap-type telephone amplifier, a speakerphone amplifier, a repeater amplifier, or an echo suppressor.

2. Description of the Prior Art

Telephone subscribers with impaired hearing or weak speech require special purpose station apparatus which will provide quality voice transmission characteristics and compensation for their particular auditory or vocal disability. Consistent with the goal of providing universal service to all telephone subscribers, the operating company requirements are such that any special equipment furnished to a subscriber must be of a sufficient grade, quality and reliability not to degrade the existing service nor prove detrimental to the telephone network.

For purposes of this application the following terms have been defined as they are commonly understood in the telephone art.

The "two-wire" portion of a telephone transmission line is formed from a single two-wire cable pair. The "four-wire" portion of the telephone transmission line includes a pair of two-wire cable pairs (hence the term "four-wire"). The "hybrid network" (which typically includes an impedance matching network) connects the two-wire portion with the four-wire portion.

Voice signals in the two-wire portion of the telephone line are normally "bidirectional" since they may originate from either end of the line. The voice signals traveling on this type of line are superimposed if both parties are talking; normally the superimposed signals are separated into discrete signals by the hybrid network. The discrete signals can travel simultaneously in opposite directions in the four-wire portion without mixing because one voice signal path is provided for transmitting (i.e., "transmit channel") and another signal path is provided for receiving (i.e., "receive channel").

The prior art has provided auxiliary handicap amplifiers which are satisfactory for amplifying transmit or receive signals at the four-wire interface between the telephone hybrid network and the receiver wire pair or the transmitter wire pair. In each of the many types of existing telephone sets which may require a handicap amplifier, it is common practice for the hybrid network and thus the handicap amplifier to be located within the set proper, or the handset, as the case may be. This requires a number of custon designed amplifiers for the various applications. The prior art has not produced a universal four-wire interface handicap amplifier which is electrically and physically compatible with the different types of station apparatus, nor has it produced a satisfactory two-wire interface handicap amplifier which can be used external to, and independent of, the station apparatus.

One of the major problems facing any handicap amplifier designer is that of impedance mismatching between the auxiliary amplifier and the central office lines. Impedances vary from line-to-line due to different loop lengths. Impedance mismatching can seriously degrade the transmission performance of a line and can introduce unwanted signal reflections (i.e., "echoes"). Moreover, under certain closed-loop conditions, these echoes, if fed back to the input of the amplifier, could cause the amplifier to become unstable and oscillate (i.e., "singing"). Consideration of a similar oscillation or singing problem is also important in designing speakerphone systems, or two-way amplifiers (i.e., repeaters), or echo suppressors. It is elementary that the sum of the gains and losses around a closed-loop system must not exceed unity for stability.

Impedance matching is usually integrated within the hybrid network design to mitigate the impedance matching problems. An amplifier inserted in either wire pair of the four-wire interface need only provide an impedance match at one port and gain in one direction only. For this reason, the prior art amplifiers are almost invariably located in one or both channels of the four-wire portion of the telephone system. For many other reasons, however, it is desirable to locate the amplifier in the two-wire portion of the telephone line.

Two-way amplification in bidirectional two-wire transmission lines has been provided by negative impedance amplifiers, or hybrid-type amplifiers or voice-switched amplifiers. These types of prior art amplifiers have several inherent problems. Negative impedance amplifiers are highly dependent upon terminating impedances and must be carefully adjusted for stability. Moreover, since this type of amplifier cannot distinguish between either direction of signal transmission, reflected signals are amplified in the same manner as transmitted signals. Hybrid-type amplifiers require balancing networks which must be carefully adjusted to maintain satisfactory line balance characteristics in the presence of any changes in the electrical characteristics of the terminating network. Voice-switched amplifiers are commonly used to eliminate many of the adjustment problems inherent in the other types of amplifiers. However, there are other drawbacks to this approach. For example, voice-switched amplifiers amplify speech signals in one direction at a time, which usually means that the listening party can be heard only when the transmitting party chooses to stop talking.

The major difficulty with all of the abovementioned amplifiers is that when inserted into a two-wire network, their impedance characteristics become a part of the network. In the practical case of a two-wire cable pair, where impedance levels at the desired insertion point can vary, they can alter the existing impedance balance—thus requiring some form of impedance compensation for optimum performance.

SUMMARY OF THE INVENTION

The voice-signal controller described herein comprises an impedance transparent power converter and a directional threshold detector which can be used as either a weak speech transmitter amplifier, a hard-of-hearing receiver amplifier, or a two-wire repeater with echo suppression.

The preferred embodiment in accordance with the present invention comprises dual power converters with preferential direction gain control, and a directional threshold detector adapted to determine the dominant direction of voice-signal flow, whereby the combination supplies voice-switched gain to the dominant signals originating from either direction and a simultaneous and equal loss to the signals propagating from the other direction.

In accordance with the present invention, a "power converter" is a two-port network device which supplies gain to the signals at one port and an equal loss to the signals at the other port. It is "bilateral" since it may accept signals simultaneously at either port; moreover, it supplies gain or loss in either port independently of its terminating impedances. Finally, the power converter is "impedance transparent", i.e., its introduction into the circuit does not ideally alter the existing impedance levels. The need for external impedance matching as with amplifiers of the prior art is therefore eliminated. The power converter concept is described more fully in S. K. Mitra, *Analysis and Synthesis of Linear Active Networks*, John Wiley and Sons, Inc., New York, 1969, Chapter 2, p. 43, and E. V. Zelyakr, "The Ideal Power Converter-A New Element of Electric Circuits", *Electrozvyaz*, No. 1, pp 35-47, 1957.

The directional threshold detector scheme includes a method of determining the dominant direction of voice-signal flow in the two-wire circuit. Means are provided to supply a directionally dependent control signal to the power converter.

BRIEF DESCRIPTION OF THE DRAWINGS

FIG. 1 is a block diagram of one arrangement of a power converter and a directional threshold detector in accordance with the present invention which can be used to provide receive gain;

FIG. 2 is a block diagram showing an arrangement in accordance with the present invention comprising dual power converters and a directional threshold detector which can be used to provide receive gain;

FIG. 3 is a block diagram showing an arrangement in accordance with the present invention which can be used as a bidirectional two-wire repeater to provide both transmit and receive gain;

FIG. 7 is a detailed circuit schematic of one embodiment of the directional threshold detector, shown in FIGS. 1-3, in accordance with the present invention.

DETAILED DESCRIPTION

Figure 4:
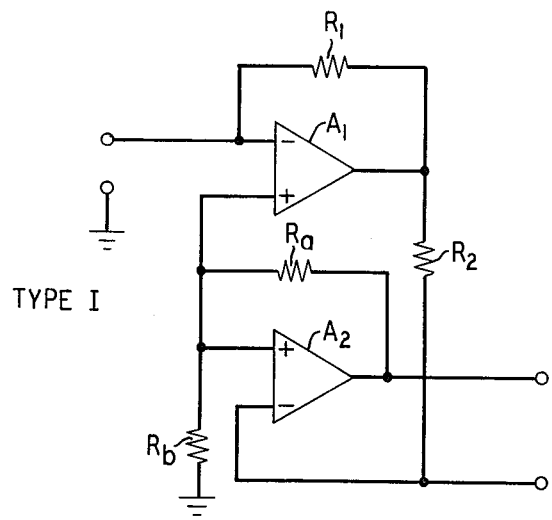
FIG. 4 is a circuit schematic diagram showing an operational amplifier realization of a power converter in accordance with the present invention.

FIG. 1 shows a power converter 1 and a directional threshold detector 2. This particular arrangement is useful as a hard-of-hearing handicap-type receive amplifier or voice-switched repeater. The power converter 1 is placed in the two-wire portion of the telephone line between the hybrid network ("hybrid") and the central office. Throughout the drawing and specification, "A" will represent the gain of the power converter in decibels in the direction of the arrow on the power converter symbol, and "−A" the corresponding loss in decibels in the opposite direction. As previously explained, in a power converter the amount of gain supplied in one direction is equal in magnitude to the amount of loss in the other direction. Hereinafter, when gain in one direction is referred to in a power converter, it implies a loss of equal magnitude in the opposite direction.

The directional threshold detector 2 senses the dominant direction of transmission through sensor resistor $R_S$ by comparing the relative magnitudes of the receive and the transmit signals. By monitoring the longitudinal voltages ($V_1$, $V_2$) at both nodes of the sensor resistor $R_s$, the directional threshold detector then interprets this information to determine in which direction the dominant signal is traveling. The sensor resistance $R_2$ is chosen to be small with respect to expected terminating impedances such that it provides a small but detectable series voltage drop. The input impedance of the threshold detector 2 is chosen to be high with respect to its expected termination impedances so as not to significantly attenuate voice signals.

The means by which this detector determines dominant signal flow direction is as follows. If for example, $V_1 > V_2$, and $V_1 > 0$, or if $V_1 < V_2$ and $V_1 < 0$, then the dominant signal flow is in the transmit direction. If $V_1 > V_2$ and $V_1 > 0$, or if $V_1 > V_2$ and $V_1 < 0$, the dominant signal flow is in the receive direction.

At low signal levels, or in the receive condition, the power converter 1 is designed to supply A dB of gain in the direction of the arrow to boost the signals originating from the central office. If the transmit signal is greater than the receive signal by a predetermined threshold interval, i.e., the absolute voltage level above which the directional threshold detector is activated, a control signal from the threshold detector 2 directs the power converter 1 to provide 0 db of gain to the signals on the telephone line.

FIG. 2 shows a preferred arrangement of dual power converters 1a, 1b and the threshold detector 2. This arrangement is also useful as a hard-of-hearing handicap amplifier or a voice-switched repeater. Yet it has several advantages over the embodiment shown in FIG. 1. At low signal levels, power converter 1a supplies "A" dB of gain in the receive direction, while power converter 1b supplies 0 dB of gain in the receive direction. Thus, the result is a net gain of A dB in the receive direction. With the proper selection of "A" at some moderate value, a modest amount of gain will be supplied to any relatively small receive signals which do not exceed the threshold interval.

As previously explained, the bidirectional threshold detector 2 senses the direction of dominant signal transmission through sensor resistor $R_s$ and provides the appropriate control signal to power converters 1a and 1b. If the receive signal is greater than the transmit signal by the threshold interval, the power converter 1a continues to supply A dB of gain and power converter 1b is controlled to supply A dB of additional gain, giving a net total of 2A dB of gain maximum in the receive direction and 2A dB of maximum loss in the transmit direction. If the transmit signal is greater than the receive signal by the threshold interval, then power converter 1a is controlled to provide 0 dB of gain and power converter 1b provides 0 dB of gain for a net total of 0 dB gain in either direction. This dilevel switching of gain eases the dynamic requirements on the power converters 1a, 1b and the directional threshold detector 2 and results in a smooth and natural sounding speech characteristic.

While FIGS. 1 and 2 refer to an embodiment useful as a hard-of-hearing amplifier, it is within the scope of this application to modify the disclosed arrangements by turning the power converters 1, 1a, and 1b around to provide gain in the transmit direction, and to operate the directional threshold detector in an opposite manner such as is required for a weak-speech amplifier or an echo suppressor. Therefore, the details of these modifications are not shown. It is understood that "echo suppression" refers to the attenuation of signals in one direction when gain is being provided to signals in the other direction.

FIG. 3 shows two power converters $1a$, $1b$ supplying gain in both the transmit and receive directions such as in a voice-switched repeater application with echo suppression. The directional threshold detector 2 acts in a similar manner, as described before, to determine the dominant direction of transmission. In its low level state, power converter $1a$ supplies 0 dB of gain to the signals in the transmit direction, and power converter $1b$ supplies 0 dB of gain in the receive direction. When the transmit signal is greater than the receive signal by the threshold interval, power converter $1a$ is controlled to supply "A" dB of gain to the signals in the transmit direction, while power converter $1b$ continues to supply 0 dB of gain to the signals in the receive direction. If the receive signal is greater than the transmit signal by the threshold interval, power converter $1b$ is controlled to supply "A" dB of gain to the signals in the receive direction and power converter $1a$ supplies 0 dB of gain to the signals in the transmit direction.

Figure 5:
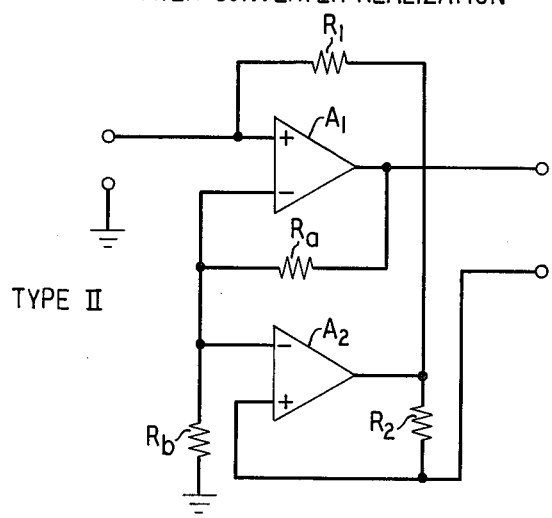
FIG. 5 is a circuit schematic diagram showing an equivalent alternate operational amplifier realization of a power converter in accordance with the present invention.

FIG. 4 and FIG. 5 each show an operational amplifier realization of a power converter in accordance with the present invention. Operational amplifiers A1 and A2 can be assumed to approach ideal operational amplifiers. These amplifiers are characterized by high open loop gain, high longitudinal input impedance, low output impedance, and a "virtual" short between the inverting and noninverting inputs.

One desirable property of the ideal power converter is impedance transparency, i.e., the impedance at either the input or output port is reflected intact at the other port. To accomplish this, identical voltage and current gains occur to the signals originating from one direction while equal voltage and current losses occur simultaneously to the signals from the reverse direction. The ratio of the voltage to current at the input port is therefore the same as the ratio of the voltage to current at the output port. Analysis of either of the circuits shown in FIGS. 4 and 5 will reveal that the direction and amount of voltage gain between ports is determined by the resistor ratio $Ra/Rb$; and the direction and amount of current gain is determined by the resistor ratio $R1/R2$. Thus, the impedance transparency can be maintained in the realizations of FIGS. 4 and 5 by the proper selection of the resistor values to maintain equal ratios.

From the above discussion, it will be clear that if the resistor ratios $R1/R2$, $Ra/Rb$ are varied then the gain of the power converter will vary accordingly. A variable resistance means was therefore selected for use in the power converter in accordance with the present invention. Optically coupled variable resistors such as that sold under the trademark RAYSISTORS by the Raytheon Company and shown in FIG. 7 as $C_{x1}$ through $C_{x4}$ are advantageously used to control the gain in the power converters inasmuch as they provide signal isolation. However, other types of variable resistors usable as control elements will suggest themselves to the users of this invention. It will also be clear that the variable resistances need not be resistances but could be reactive impedances also, as long as the constraints of the ratios are maintained. The two realizations shown in FIGS. 4, 5 are the full functional equivalences of each other and are functionally interchangeable; accordingly, hereinafter reference will be made to the power converter shown in FIG. 4.

Figure 6:
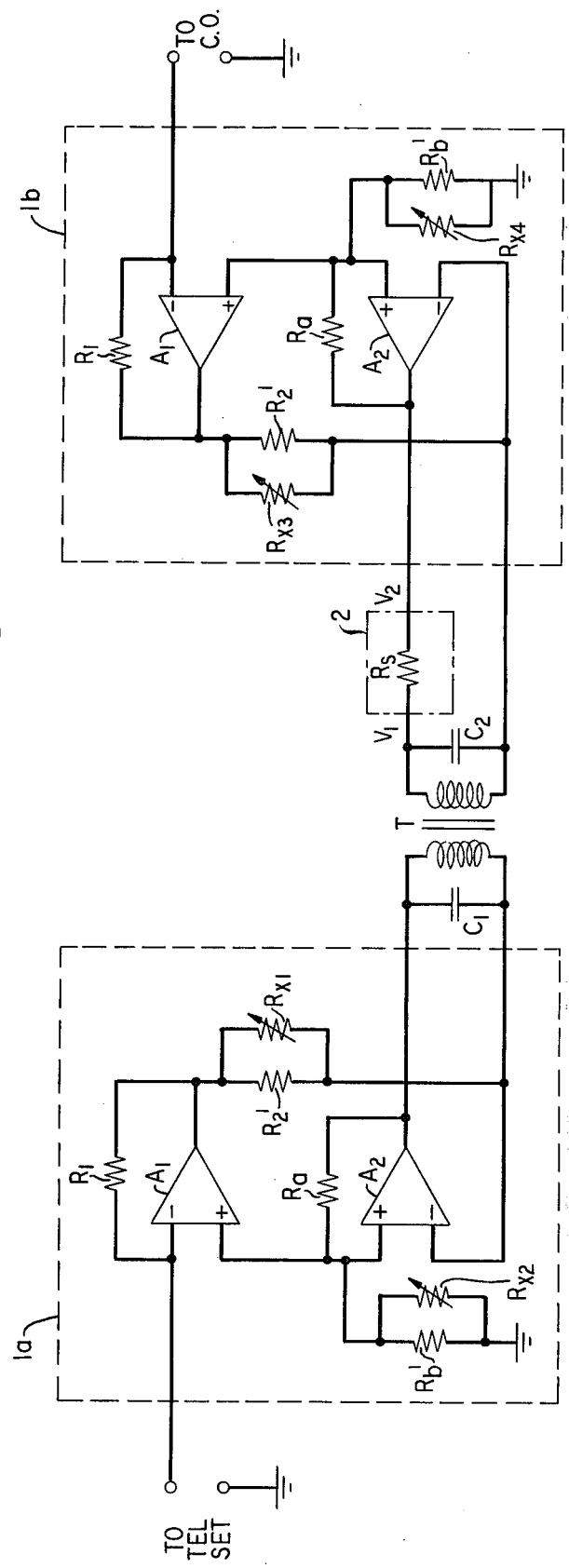
FIG. 6 is a detailed circuit schematic of one embodiment of the dual power converter arrangement of FIG. 2 in accordance with the present invention.

FIG. 6 shows a preferred embodiment of the dual power converter arrangement of FIG. 2, using the type of power converter shown in FIG. 4. The value of the resistor ratios $R1/R2$ and $Ra/Rb$ are controlled by the variable resistances $Rx_1$ through $Rx_4$, which with the fixed resistances $R2'$ and $Rb'$, form R2 and Rb, respectively, of FIG. 4 for each power converter. The variable resistors are caused to become smaller as a result of an applied control signal to their respective control elements. For the application of FIG. 2, the resistor ratios $R1/R2$, $Ra/Rb$ of power converter 1a are chosen to be "A" dB with no applied control signal and unity (0 dB) with a fully applied control signal. Power converter 1b has its corresponding resistor ratios set at unity for no applied control signal and "A" dB for a fully applied control signal. The variable resistors are controlled such that the resistor ratios, and thus the voltage and current gains, can be varied while being maintained equal in magnitude at all times. The dominant direction of transmission is derived from voltage measurements across the sensor resistor $R_s$ (which is purposely chosen to be small so as not to perturb the voice signals). Operational amplifiers A1 and A2 are of the type previously described for FIG. 4. Transformer T and capacitors $C_1$, $C_2$ are added to provide direct current ("DC") isolation and high frequency roll-off. In an arrangement which requires a DC path, a bypass circuit can be inserted around the dual power converters.

FIG. 7 shows a preferred embodiment of the directional threshold detector 2 shown in FIGS. 1–3. The amplifier A3 amplifies the magnitude of the difference in longitudinal voltages $V_1$, $V_2$, across sensor resistor $R_s$ and amplifier A4 amplifies the longitudinal voltage $V_1$. A difference in longitudinal voltages $V_1$, $V_2$ that is below the threshold interval will not activate the threshold detector 2. When the difference between the transmit and receive levels is greater than the threshold interval, the detection of the dominant signal flow is determined as follows.

If the algebraic difference in longitudinal voltages $(V_1-V_2)$ is positive, and if $V_1$ is positive, then transistor $T_4$ is turned on and transistor $T_1$ is turned off—which disables transistor $R_3$ and enables transistor $T_2$. If the algebraic difference in longitudinal voltages $(V_1-V_2)$ is positive, and if $V_1$ is negative, then transistor $T_1$ is turned on and transistor $T_4$ is turned off—which disables transistor $T_2$ and enables transistor $T_3$. If the algebraic difference in longitudinal voltages $(V_1-V_2)$ is negative, then both transistor $T_2$ and $T_3$ are disabled. If $T_2$ is enabled and $T_3$ disabled, then a positive voltage will be present at the output of the differential amplifier A5. This voltage turns on transistor $T_5$ thereby activating control elements $C_{x1}$ and $C_{x2}$ which respectively incorporate variable resistances $R_{x1}$ and $R_{x2}$ and are in series with transistor $T_5$. If $T_3$ is enabled and $T_2$ disabled, then a negative voltage will be present at the output of amplifier A5. This voltage enables transistor $T_6$ thereby activating control elements $C_{x3}$ and $C_{x4}$ which respectively incorporate variable resistances $R_{x3}$ and $R_{x4}$ and are in series with transistor $T_6$. Thus the voltage as measured across sensor resistor $R_s$ senses the dominant direction of transmission and activates the appropriate control elements. The corresponding resistor ratios are caused to vary the gain of the power converters accordingly in the preferred direction.

Although the power converter in the present embodiment is disclosed in combination with a directional threshold detector to provide a voice-signal controller suitable for use in the two-wire portion of the transmission line, this combination is equally useful with respect to AC-signals outside of the voice frequency band. The term "AC-signal" is intended to embrace both alternating current in its classical sense, i.e., a flow of electricity that reaches a maximum in one direction, decreases to zero, then reverses itself and reaches a maximum in the opposite direction; and alternating current in a more general sense, i.e., a signal of varying amplitude which may flow in only one direction. In addition, the use of the power converter is not limited to AC-signals. It can also find application in an arrangement where DC-signals are involved. All such variations and modifications are intended to be included within the scope of this invention as defined in the appended claims.

What is claimed is:

1. A bilateral AC-signal controller suitable for use in the two-wire portion of a telephone transmission line comprising:
   a. a power converter disposed in said two-wire line, and
   b. a directional threshold detector serially disposed in said two-wire line and adapted to supply a control signal to said power converter in response to the direction of AC-signal flow in said two-wire line.

2. The controller of claim 1 including a second power converter disposed in said two-wire circuit, and wherein said directional threshold detector is adapted to supply control signal to each of said power converters in response to the direction of AC-signal flow in said two-wire lines.

3. A power converter comprising in combination:
   a first operational amplifier having a first impedance element connected between an output terminal and an inverting input terminal of said first amplifier;
   a second operational amplifier having a second impedance element connected between an output terminal and a noninverting input terminal of said second amplifier;
   a first biasing means connecting the output terminal of said first amplifier to an inverting terminal of said second amplifier; and
   a second biasing means connecting a noninverting terminal of said first amplifier and the noninverting terminal of said second amplifier with a ground source of reference potential.

4. The power converter according to claim 3 serially disposed in a two-wire transmission line wherein said power converter is adapted to supply identical current and voltage gains to a signal originating from one direction and a simultaneous and equal current and voltage loss to a signal from the reverse direction, said direction and amount of current gain being determined by the ratio of said first impedance element to said first biasing means and said direction and amount of voltage gain being determined by the ratio of said second impedance element to said second biasing means.

5. The power converter according to claim 3 wherein said first and second biasing means comprise variable resistances.

6. A power converter comprising in combination:
   a first operational amplifier having a first impedance element connected between an output terminal and an inverting input terminal of said first amplifier;
   a second operational amplifier having a second impedance element connected between an output terminal of said second amplifier and a noninverting input terminal of said first amplifier;
   a first biasing means connecting the inverting terminal of said first amplifier and an inverting terminal of said second amplifier with a ground source of reference potential; and
   a second biasing means connecting the output terminal of said second amplifier to a noninverting terminal of said second amplifier.

7. The power converter according to claim 6 serially disposed in a two-wire transmission line wherein said power converter is adapted to supply identical current and voltage gains to a signal originating from one direction and a simultaneous and equal current and voltage loss to a signal from the reverse direction, said direction and amount of current gain being determined by the ratio of said second impedance element to said second biasing means and said direction and amount of voltage gain being determined by the ratio of said first impedance element to said first biasing means.

8. The power converter according to claim 6 wherein said first and second biasing means comprise variable resistances.

* * * * *

UNITED STATES PATENT AND TRADEMARK OFFICE
CERTIFICATE OF CORRECTION

PATENT NO. : 4,065,646

DATED : December 27, 1977

INVENTOR(S) : Peter O. Schuh

It is certified that error appears in the above-identified patent and that said Letters Patent are hereby corrected as shown below:

Column 1, line 57, "custon" should read --custom--. Column 4, line 10, "$R_2$" should read --$R_s$--; line 21, before "and", first occurrence, that portion of the equation reading "$V_1 > V_2$" should read --$V_1 < V_2$--; line 60, "dilevel" should read --bilevel--.

Signed and Sealed this

Fifteenth Day of August 1978

[SEAL]

Attest:

RUTH C. MASON
Attesting Officer

DONALD W. BANNER
Commissioner of Patents and Trademarks